United States Patent [19]

Shipman

[11] 3,965,381

[45] June 22, 1976

[54] ELECTRIC MOTOR HOUSING WITH INTERIOR SHIELD AGAINST LIQUIDS

[75] Inventor: Vern D. Shipman, Richardson, Tex.

[73] Assignee: Headway Research, Inc., Garland, Tex.

[22] Filed: Sept. 12, 1974

[21] Appl. No.: 505,256

Related U.S. Application Data

[62] Division of Ser. No. 267,683, June 29, 1972, Pat. No. 3,862,856.

[52] U.S. Cl. .................................. 310/88; 310/157; 279/3
[51] Int. Cl.² ........................................ H02K 5/10
[58] Field of Search .................. 310/85, 42, 88, 157, 310/89, 87, 66, 90, 272, 273; 117/101; 417/360, 372, 424; 279/3; 335/289, 294

[56] References Cited
UNITED STATES PATENTS

| | | | |
|---|---|---|---|
| 2,381,834 | 8/1945 | Meredew | 417/360 |
| 2,450,137 | 9/1948 | Harlamoff | 310/66 |
| 2,598,547 | 5/1952 | Ivanoff | 417/372 |
| 2,911,918 | 11/1959 | Reed | 310/88 |
| 2,913,988 | 11/1959 | White | 310/88 |
| 3,203,353 | 8/1965 | Ruby | 310/85 |
| 3,441,762 | 4/1969 | Luenberger | 310/89 |
| 3,730,134 | 5/1973 | Kadi | 279/3 |

*Primary Examiner*—R. Skudy
*Attorney, Agent, or Firm*—Charles W. McHugh

[57] ABSTRACT

A construction for an electric motor, which motor is adapted to be installed and operated in a generally vertical mode. The rotor shaft of the motor extends upward through the top wall (or cap) of the stator housing. With this vertical orientation, however, there exists the possibility of unwanted liquids flowing downward alongside the rotor shaft into the housing where they could cause damage to the motor windings, etc To protect sensitive interior parts of the motor, an annular trough is interiorly provided for capturing such liquids as may enter the housing by flowing downward along the rotor shaft. A shield or skirt is sealingly attached to the rotor shaft within the housing at a position where the shield extends radially outward over the trough. Drainage passages connect the trough to the exterior of the housing, such that unwanted liquids will be initially captured and then drained from the housing before they can reach an interior location where they could cause damage.

5 Claims, 2 Drawing Figures

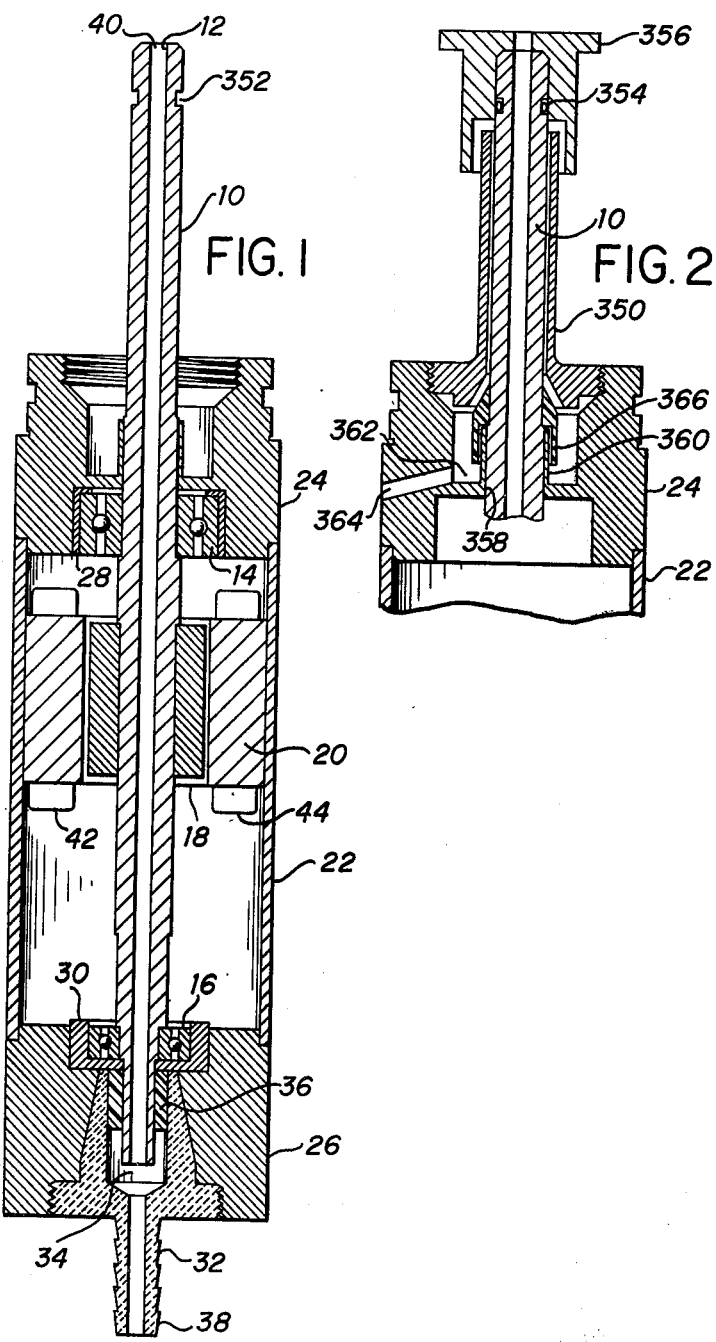

ELECTRIC MOTOR HOUSING WITH INTERIOR SHIELD AGAINST LIQUIDS

This is a division of Ser. No. 267,683 filed June 29, 1972, now U.S. Pat. No. 3,862,856.

This invention relates generally to housings for electric motors, and particularly to housings which are likely to be installed in an environment where the presence of liquids is an occasional problem. More specifically, it relates to motors which are occasionally subjected to the hazard of a deleterious liquid flowing axially along the motor's shaft, as when a cleaning solvent is poured over a motor whose shaft is vertically oriented.

In the art of making integrated circuits and the like, it is well known to provide a platform at the end of a shaft for holding a substrate, and also to provide a means for rotating the shaft after the substrate has been coated with a masking liquid. The whirling or spinning of the platform causes the liquid to be subjected to centrifugal forces, and produces a predictable profile in the dry film which is obtained when the liquid dries. Such films have found widespread use in the semiconductor industry because these films can be readily obtained in submicron thickness.

In the past, only three parameters had been of significance in evaluating the spinners or whirlers that have been used to support and rotate the substrates; these three parameters were the eventual speed at which the platform (and the vacuum-held substrate) could be rotated, the stability with which that speed could be held, and the acceleration at which the platform could be brought up to speed. These parameters had been generally satisfied with DC motors of various types, although each of them was subject to various kinds of failure inherent to DC motors, e.g., brush failure.

An improvement in motors for use in microelectronic spinners has now been taught, which comprises an AC motor with a permanent magnet and a means for starting the motor. An AC motor with a permanent magnet overcomes all of the disadvantages of DC motors in that it has no commutator, it has no wire on the rotating components and the operation is very smooth and quiet. The stator windings in an AC motor can be well impregnated for protection, and there is essentially nothing to wear out except possibly the bearings that support the rotor.

A further advantage of the motor disclosed herein lies in the construction of the motor housing. As mentioned above, it is common to flood the wafer or substrate with liquid and permit any excess to passively drain off or be thrown off during initial movement of the platform. Any liquid that does not remain on the substrate flows over the edge of the platform and is usually collected in a pan or drum beneath the motor. Since the shaft of the motor of necessity has to be oriented in a vertical direction, the bearing between the fixed housing and the rotating shaft were typically exposed to physical contact with the excess liquids draining off the platform. Attempts were made in the past to design the vacuum chuck (which is attached to the top end of the shaft) so that excess production liquids could flow around but not into the motor housing. In practice, however, it has been found that some operators energetically remove the protective chuck and flush the entire apparatus with solvent when they are cleaning it. Without the vacuum chuck in place, these harsh cleaning fluids had direct access to the interior of the motor. Rotary seals between the shaft and the housing could not guard against such occasional misuse of the equipment since rotary seals were not available that could tolerate the high speeds of rotation (e.g., 12,000 rpm). Even Teflon seals with their low coefficient of friction and high heat tolerance were not an adequate solution. Hence, there has been a long-felt need for some way to protect whirler motors during normal operation with a vacuum chuck installed, as well as during the occasional instances of operation when the vacuum chuck was removed. In accordance with this invention, a mechanical construction involving no physical contact between the shaft and the housing is provided to exclude liquids; this construction has no parts which are subject to wear, and which is not susceptible to failures of the past.

In view of the foregoing remarks, it will be apparent that it is an object of this invention to provide a housing for a high speed motor wherein sealing against occasional liquids is mandatory.

Another object is to provide an improved motor housing which has an internal shield against liquids, which shield cannot be defeated or rendered inoperative.

Still another object is to provide a motor housing which is particularly well suited for micro-electronic production work wherein the presence of harsh solvents and liquids are typical environmental problems.

These and other objects of the invention will be apparent from the specification and claims and from the attached drawings in which:

FIG. 1 is a cross section of a permanent magnet motor for driving a rotary table; and FIG. 2 is a cross sectional view of the upper part of the permanent magnet motor of FIG. 1 detailing the vacuum chuck mounting and liquid draining construction.

Referring specifically to FIG. 1, a rotor shaft 10 is slotted, as at 12, to engage a fitting in a rotary table, which typically is a vacuum chuck. The substrate to be covered is placed on top of the chuck in a well known manner, and the photoresist material or other film-forming liquid is deposited on the substrate. The amount of liquid which is supplied is always more than is required in the dried film, and the excess that is not held on a rotating substrate by surface tension, adhesion or cohesion, is eventually slung off as the platform rotates. The initial depth of the liquid on top of a substrate is typically about 0.020 inch, but this controlled depth is strongly dependent on the known viscosity of the liquid. As illustrated, the rotor shaft 10 is supported in bearings 14 and 16 and supports a permanent magnet rotor 18 in a spaced relationship with a stator 20. Supporting the field 20 is a motor housing 22 enclosed by end bells 24 and 26. The top end bell 24 includes a bearing seat 28 into which the bearing 14 is fitted. At the bottom end bell 26 there is a bearing seat 30 into which the bearing 16 is fitted. Threaded into an opening of the end bell 26 is a vacuum line fitting 32 for applying a vacuum to a chamber 34. A rotating seal 36 surrounds the shaft 10 to provide a vacuum tight chamber. A vacuum source attached to the line 38 produces a vacuum at the opening 40 of the shaft 10 by means of an axial passage extending through the shaft into the chamber 34. Such a motor can be readily designed to have a sustained operating speed of 12,000 rpm.

Referring now to FIG. 2, the motor housing includes a stator housing 22 in which the coils are permanently mounted. For convenience in manufacturing, the stator housing 22 is initially open at both ends, and is provided with two end caps which are referred to (according to their orientation when installed) as the top cap and the bottom cap. The top cap is itself conveniently fabricated in two pieces which are later joined; for clarity, the piece which is typically attached to the stator housing 22 by bolts is called the end bell 24, and the piece which is shown as threadedly attached to the end bell is called the shaft protector stem 350. A groove 352 for an O-ring 354 or the like is provided near the upper end of the rotor shaft 10, and an O-ring in that groove provides a sealing means between the shaft and the vacuum chuck 356. The shaft protector stem 350 extends well under the vacuum chuck 356 for a distance which is adequate to prevent the entrance of any of the production liquids into the stator housing.

The end bell 24 is provided with an aperture 358 through which the rotor shaft 10 extends; this aperture is surrounded by an upstanding lip 360. Outwardly from the aperture 358 and from the lip 360 is a trough or groove 362 that extends completely around the aperture. For compactness, the upstanding lip 360 advantageously constitutes a wall in common between the aperture 358 and the trough 362. A passage 364 is also provided in said end bell 24 for the purpose of draining to the housing exterior such liquids as may be captured in the trough.

With the vacuum chuck 356 in its normal position, there is no way that production liquids could be forced up and over the protector stem 350 where they might have an opportunity to reach the motor interior. If the vacuum chuck 356 is removed, and a cleaning solvent were to be deliberately poured around the stem 350 and shaft 10, it is true that some of the solvent would probably enter the exposed end of the stem; but even such a zealous attempt by an operator to bathe everything (including the motor interior) with a cleaning solvent will be thwarted by shield or skirt 366 which is attached to the shaft 10 internally of the housing. The shield 366 is preferably made of a light weight plastic material such as Delrin; hence it adds little to the inertia of the stainless steel shaft. The shield 366 is manufactured with an internal diameter which provides at least a force fit on the shaft 10; as such, it may properly be described as being sealingly attached to the shaft.

In its installed position on the shaft 10 and deep within the housing, the shield extends radially outward over the upstanding lip 360 and—depending on the vertical length of the shield—can also extend down into the trough 362. In this preferred embodiment, the shield 366 is illustrated as rather long; but while such length provides great reliability, it is not mandatory, especially since the slinging action of the rotating shield tends to throw any liquid well away from the aperture 358 and toward the outer wall of the trough. Any liquids that should happen to enter the protector stem 350 will follow a harmless flow path including movement partially down the shaft, radially off the shield and into the trough 362, and through the passage 364 from the trough to the exterior of the stator housing.

While only one embodiment of the invention has been described herein and shown in the accompanying drawings, it will be evident that various further modifications are possible without departing from the scope of the invention.

What is claimed is:

1. A construction for an electric motor, comprising:
   a. a stator housing having a top end cap, said end cap having an aperture through which the rotor shaft extends, and said aperture being surrounded interiorly of the cap by an upstanding lip and a trough, and said housing having at least one passage for draining such liquids as may be captured in said trough to the exterior of the housing; and
   b. a shield sealingly attached to the rotor shaft interiorly of the cap, said shield extending radially outward over said upstanding lip and above the trough, whereby liquids which may pass through the aperture in the end cap and flow alongside the rotor shaft will flow radially off the shield and into the trough from which they subsequently drain to the exterior of said stator housing.

2. The motor housing as claimed in claim 1 wherein the upstanding lip constitutes a wall in common between said aperture and said trough.

3. The motor housing as claimed in claim 1 wherein the shield further has a depending skirt that extends downwardly into the trough, such that it covers at least a portion of the upstanding lip.

4. The motor housing as claimed in claim 1 wherein each of the passages for draining liquids from the trough has a slope away from the top end cap, whereby the passages slope downwardly when the motor housing is upright and vertically oriented 5. The motor housing as claimed in claim 1 wherein the shield is formed with an internal diameter which is less than the outer diameter of that portion of the motor shaft to which it is attached, a force fit manner so that the shield is seated on and attached to the rotor shaft.

* * * * *